United States Patent [19]

Ohlenburger

[11] Patent Number: 4,583,149
[45] Date of Patent: Apr. 15, 1986

[54] DEVICE FOR HEAT DISSIPATION OF PRINTED CIRCUIT PLATES

[75] Inventor: Hans Ohlenburger, Überlingen, Fed. Rep. of Germany

[73] Assignee: Bodenseewerk Geratetechnik GmbH, Bodensee, Fed. Rep. of Germany

[21] Appl. No.: 639,833

[22] Filed: Aug. 13, 1984

[30] Foreign Application Priority Data

Aug. 30, 1983 [DE] Fed. Rep. of Germany ....... 3331112

[51] Int. Cl.⁴ .............................................. H05K 7/20
[52] U.S. Cl. .................................. 361/387; 165/80.2; 361/415
[58] Field of Search ............... 361/395, 399, 412, 415, 361/386, 387, 388; 174/16 HS; 165/80 B, 80 C, 185; 211/41

[56] References Cited

U.S. PATENT DOCUMENTS

| | | | |
|---|---|---|---|
| 3,487,267 | 12/1969 | Winston | 361/388 |
| 3,631,325 | 12/1981 | Wenz | 317/100 |
| 4,386,390 | 5/1983 | Hammond | 361/415 |
| 4,475,145 | 10/1984 | Heil | 361/388 |

FOREIGN PATENT DOCUMENTS

| | | |
|---|---|---|
| 1243252 | 6/1967 | Fed. Rep. of Germany . |
| 2336168 | 10/1974 | Fed. Rep. of Germany . |
| 2744341 | 4/1979 | Fed. Rep. of Germany . |
| 7740059 | 4/1980 | Fed. Rep. of Germany . |
| 8221756 | 11/1982 | Fed. Rep. of Germany . |
| 2413016 | 12/1977 | France . |

Primary Examiner—G. P. Tolin
Attorney, Agent, or Firm—Lee, Smith & Zickert

[57] ABSTRACT

Printed circuit plates (12) are held at their edges in a housing (10) and carry on one side electrical components (16). For heat dissipation of the printed circuit plates (12) these plates carry a good heat conducting layer (20). The heat conducting layer (20) is in heat conducting contact with the housing through a heat dissipation block (22) provided in the center range of the printed circuit plates (12).

6 Claims, 3 Drawing Figures

DEVICE FOR HEAT DISSIPATION OF PRINTED CIRCUIT PLATES

The invention relates to a device for heat dissipation of printed circuit plates, which are held at their edges in a housing and which carry on one side electrical components, in which device (a) the printed circuit plates carry on said one side a good heat conducting layer.

The electrical components mounted on printed circuit plates can generate considerable heat. This heat must be dissipated in order to prevent the risk of overheating and resulting damages of the components. A further problem results from the request often made, that the apparatus is resistant against vibrations and passes certain vibration tests. The printed circuit plates only clamped at the edges have a tendency to resonances at certain frequencies. These resonances can load the mounting of the components on the printed circuit plates overproportionally and cause failures.

It is the object of the invention to provide a device for heat dissipation of printed circuit plates, which ensures good heat dissipation of the heat produced by the electrical components.

According to the invention this object is achieved in that (b) the heat conducting layer is in additional heat conducting contact with the housing through a heat conducting block provided in a center area of the printed circuit plate.

In this manner the heat developped by the components is on one hand transmitted through the heat conducting layer to the edges of the printed circuit plate, where the plate is held in the housing, and therefrom it is transmitted to the housing. On the other hand the heat is dissipated through the heat conducting block out of the center range of the printed circuit plate. The heat conducting block offers at the same time an additional mechanical support of the printed circuit plate in the center range, whereby the mechanical stability of the arrangement is improved and the risk of resonance vibrations is reduced.

Modifications of the invention are subject matter of the sub-claims.

An embodiment of the invention will now be described in greater detail with reference to the accompanying drawings.

Figure 1:
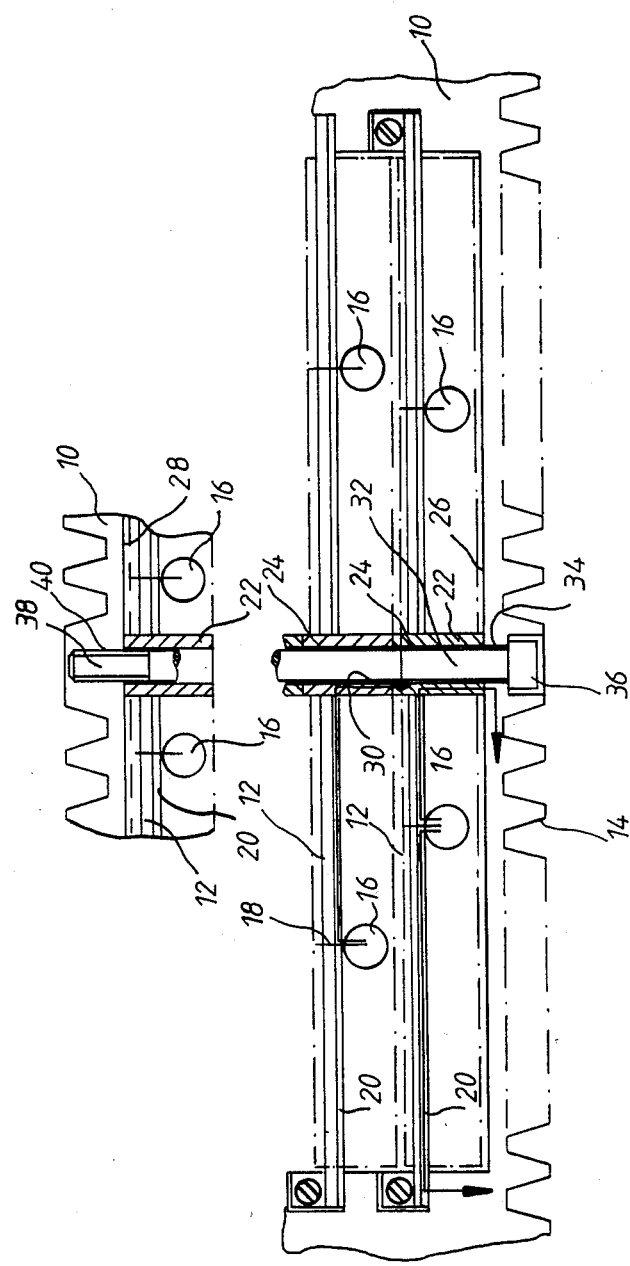
FIG. 1 shows a sectional view of a housing having printed circuit plates arranged therein.

In a housing 10 printed circuit plates 12 are held at their edges. The housing 10 consists of a good heat conducting metal and is provided with cooling ribs 14. The printed circuit plates 12, on one side (at the bottom in FIG. 1), carry electric components 16. The components 16 extend in usual manner with connecting wires 18 through the printed circuit plates 12 and are soldered on the other side, at the top in FIG. 1 (soldering side), to conductor pathes.

Figure 3:
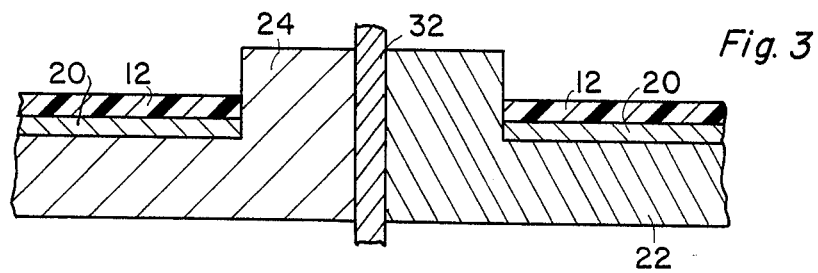
FIG. 3 shows an enlarged cross-sectional view of a printed circuit plate taken along lines 3—3 of FIG. 2.
Figure 2:
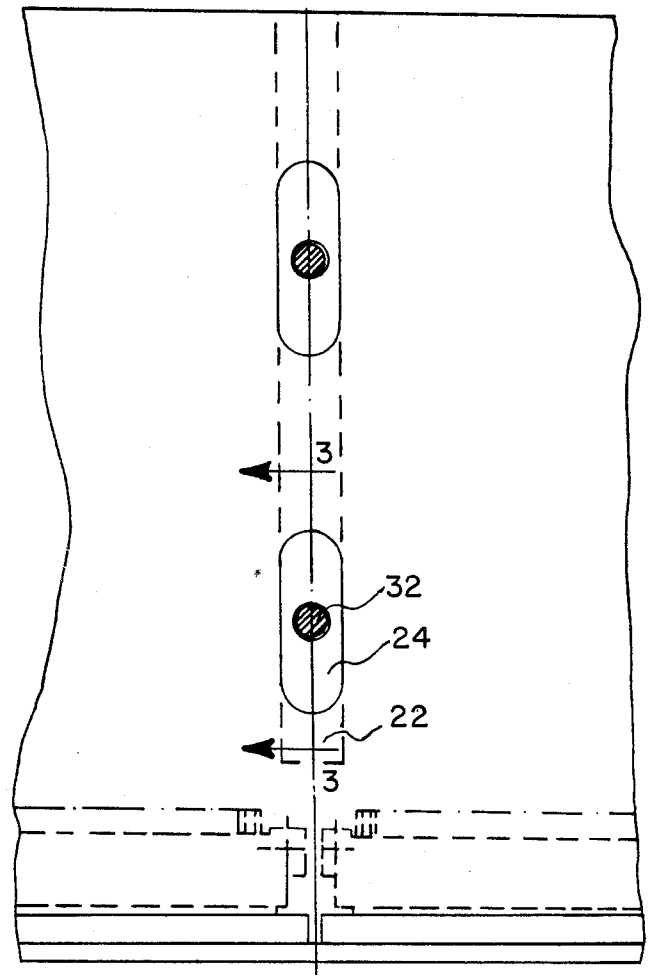
FIG. 2 shows a plan view of one of the printed circuit plates as viewed from the soldering side.

On the side where the electrical components 16 are located, the printed circuit plates 12 carry a good heat conducting layer 20. In the illustrated preferred embodiment the heat conducting layer 20 is a heat conducting plate which is mounted on the printed circuit plate 12. The heat conducting layer 20 is in additional heat conducting contact with the housing 10, through a heat conducting block 22 which is provided in the center area of the printed circuit plate 12. In the preferred embodiment the heat conducting block 22 is a metal ledge provided on the side of the heat conducting layer 20 and being in heat conducting contact therewith, and extending across the printed circuit plate 12. Projections 24 are provided on the metal ledge, and extend through the heat conducting layer 20 and the printed circuit plate 12. As can be seen from FIG. 2, and also in FIG. 3, in the preferred embodiment the projections 24 have oblong shape and extend along the metal ledge.

A plurality of printed circuit plates 12 are arranged parallel to each other and spaced from each other in the housing 10. The heat conducting block 22 of each printed circuit plate 12 engages the inner wall 26 of the housing 10 or the projections 24 of the heat conducting block 22 of the adjacent printed circuit plate 12, as illustrated in FIG. 1 for the upper one of the two printed circuit plates 12. The printed circuit plates are arranged between and parallel to opposite inner walls 26,28 of the housing 10. The end plate on one side (the lowest printed circuit plate 12 in FIG. 1) with the heat conducting block 22 engages the inner wall of the housing 10. The end plate on the other side (the top printed circuit plate 12 in FIG. 1) with said projections 24 of the heat conducting block 22 engages the opposite inner wall 28. Aligning bores 30 are provided in the heat conducting blocks 22 and in the projections of the printed circuit plates 12 arranged parallel one above the other. Threaded bolts 32 are guided through these bores. The threaded bolts 32 pass through bores 34 of the housing 10 on one side and there with their heads 36 engage the outside of the housing 10. The threaded bolts 32 are screwed with threads 38 in threaded bores 40 on the opposite side of the housing. Then the opposite walls of the housing 10 and the heat dissipation blocks 22 can be drawn together by tightening the threaded bolts, whereby the thermal contact is improved. Preferably the heat dissipation blocks 22 are made of aluminum.

I claim:

1. Device for heat dissipation including printed circuit plates (12) which are held at their edges in a housing (10) and which carry electrical components on one side and which have strip conductors on the other side, in which
   (a) the printed circuit plates (12) carry on said one side a good heat conducting layer (20), which is in heat conducting contact at the edges of the printed circuit plate (12) with the opposing first wall portions of the housing (10), characterized in that
   (b) a dissipation block (22) is provided in a center area away from the edges of each printed circuit plate (12) projecting perpendicular to the plane of each printed circuit plate, through which blocks an additional heat conducting path is established between the printed circuit plate (12) and a second wall portion of the housing (10), said second wall portion extending substantially parallel to the printed circuit plate between the first wall portions, said dissipation block comprising an integral body which is held in close heat conducting contact with said heat conducting layer of said printed circuit plate and which is firmly attached in close heat conducting contact to heat conducting means for dissipating heat to said housing.

2. Device as set forth in claim 1, in which the printed circuit plates (12) are arranged parallel to each other and spaced from each other, and characterized in that
   (a) projections (24) are provided on the dissipation blocks (22) provided on said one side of the printed circuit plates (12), which projections extend through the heat conducting layer (20) and the printed circuit plate (12) to the other side of the printed circuit plate (12), and
   (b) dissipation blocks (22), with their end faces parallel to the printed circuit plates (12), engage an inner wall of the housing (10) or the projections (24) of the dissipation block of the adjacent printed circuit plate (12), respectively.

3. Device as set forth in claim 1, characterized in that the dissipation blocks (22) are metal ledges, which extend across the printed circuit plates (12).

4. Device as set forth in claim 2, characterized in that a plurality of projections (24) is provided on each dissipation block (22).

5. Device as set forth in claim 3, characterized in that
   (a) the printed circuit plates (12) are arranged parallel to inner walls on opposite sides (26, 28) of the housing (10) and
   (b) the end printed circuit plate on one side engages one inner wall (26) of the housing (10) with its associated dissipation block (22) and the end printed circuit plate on the other side engages the inner wall (28) on the opposite side of the housing (10) with the said projections (24) of its associated dissipation block (22).

6. Device as set forth in claim 4, characterized in that
   (a) aligned bores (30) are provided in the heat dissipation blocks (22) and in the projections (24) of the printed circuit plates (12) when arranged parallel one above the other, and
   (b) threaded bolts (32) extend through the bores (30), which bolts pass through bores (34) of the housing (10) on one side and which, with their heads (36), engage the outer side of the housing (10) and which are threadedly engaged in threaded bores (40) on the opposite side of the housing (10).

* * * * *